United States Patent
Yarus et al.

(10) Patent No.: US 10,359,540 B2
(45) Date of Patent: Jul. 23, 2019

(54) CART-BASED PROXY FLOW SIMULATION PROCEDURE FOR RANKING GEOSTATISTICAL REALIZATIONS OF ROCK PROPERTIES

(71) Applicant: Landmark Graphics Corporation, Houston, TX (US)

(72) Inventors: Jeffrey Marc Yarus, Houston, TX (US); Rae Mohan Srivastava, Toronto (CA); Marko Maucec, Englewood, CO (US)

(73) Assignee: Landmark Graphics Corporation, Houston, TX (US)

( * ) Notice: Subject to any disclaimer, the term of this patent is extended or adjusted under 35 U.S.C. 154(b) by 629 days.

(21) Appl. No.: 14/894,326

(22) PCT Filed: Aug. 30, 2013

(86) PCT No.: PCT/US2013/057650
§ 371 (c)(1),
(2) Date: Nov. 25, 2015

(87) PCT Pub. No.: WO2015/030811
PCT Pub. Date: Mar. 5, 2015

(65) Prior Publication Data
US 2016/0170087 A1    Jun. 16, 2016

(51) Int. Cl.
*G06F 17/50* (2006.01)
*G01V 99/00* (2009.01)

(52) U.S. Cl.
CPC ............ *G01V 99/005* (2013.01); *G06F 17/50* (2013.01)

(58) Field of Classification Search
CPC ........................................................ G06F 17/50
USPC ................................ 703/2, 5, 9, 10; 348/143
See application file for complete search history.

(56) References Cited

U.S. PATENT DOCUMENTS

| 8,717,437 | B2* | 5/2014 | Soatto ................. | G06K 9/4671 348/143 |
| 9,418,317 | B2* | 8/2016 | Soatto ................. | G06K 9/4671 |
| 2007/0005253 | A1 | 1/2007 | Fornel et al. | |
| 2009/0055141 | A1 | 2/2009 | Moncorge et al. | |
| 2009/0248312 | A1 | 10/2009 | Hsu et al. | |
| 2010/0082258 | A1 | 4/2010 | Wang et al. | |
| 2013/0215264 | A1* | 8/2013 | Soatto ................. | G06K 9/4671 348/143 |
| 2014/0301635 | A1* | 10/2014 | Soatto ................. | G06K 9/4671 382/159 |

FOREIGN PATENT DOCUMENTS

WO    WO2015038163 A1    3/2015

OTHER PUBLICATIONS

International Search Report and Written Opinion, dated May 19, 2014, 14 pages, Korean International Searching Authority.
(Continued)

*Primary Examiner* — Thai Q Phan
(74) *Attorney, Agent, or Firm* — Haynes and Boone, LLP

(57) ABSTRACT

A system and method for performing classification and regression tree flow simulations for reservoir. A partial flow simulation is performed. Dynamic properties associated with the partial flow simulation are stored for each time step. CART is utilized to predict changes in the dynamic properties utilizing stored dynamic properties determined by the partial flow simulation.

20 Claims, 3 Drawing Sheets

(56) References Cited

OTHER PUBLICATIONS

Chandra Prasetyo Utomo, The Hybrid of Classification Tree and Extreme Learning Machine for Permeability Prediction in Oil Reservoir, International Journal of Computer Science Issues (IJCSI), Jan. 2013, 9 pages, vol. 10, Issue 1, No. 1, ISSN (Print): 1694-0784, ISSN (Online): 1694-0814.

* cited by examiner

CART-BASED PROXY FLOW SIMULATION PROCEDURE FOR RANKING GEOSTATISTICAL REALIZATIONS OF ROCK PROPERTIES

CROSS-REFERENCE TO RELATED APPLICATIONS

This application is a U.S. National Stage patent application of International Patent Application No. PCT/US2013/057650, filed on Aug. 30, 2013, the benefit of which is claimed and the disclosure of which is incorporated herein by reference in its entirety.

BACKGROUND

Computational and simulation processes for estimating natural resource reserves and production have improved significantly in recent years. In many cases, Earth models are first generated for a target area. For example, the earth model may represent reservoir characterization for an oil field. A geo-cellular models may then be applied to the earth model for the target area to estimate how fluid may move through the earth model. The geo-cellular model may be utilized to make production predictions for estimating reserves, production capabilities, and improving production schemes.

A large amount of data is required to perform the different types of modeling. In addition, there are a number of properties, parameters, and uncertainties that affect both the Earth models and flow simulations that may be created. In order to properly characterize the impact of each parameter and uncertainty that may affect natural resource production, the largest possible number of scenarios is typically simulated. As a result, flow simulations may require extensive data, user and computing time, and computational resources to arrive at accurate results.

BRIEF DESCRIPTION OF THE DRAWINGS

Illustrative embodiments of the present system and method are described in detail below with reference to the attached drawing figures, which are incorporated by reference herein and wherein.

DETAILED DESCRIPTION OF THE DRAWINGS

The illustrative embodiments provide a system, method, and non-transitory computer readable medium including computer executable instructions for classification and regression tree (CART) based proxy flow simulations for ranking geostatistical realizations of earth formations. As defined herein, realizations are the different versions of static and dynamic properties that affect flow of natural resources within an examined environment, such as a reservoir. Realizations may be similar to simulations of rock and earth composition properties.

The illustrative embodiments may utilize predictive analytics for statistical prediction as a coarse model instead of finite flow computations. Predictive analytics encompass a variety of techniques and processes from statistics, modeling, and data mining that analyze current and historical facts to make predictions, models, or simulations about future or unknown events, such as flow characteristics of a reservoir. CART may also be referred to as recursive partitioning. Decision trees utilized in CART are formed by a collection of rules based on variables that are selected to best differentiate observations based on a dependent variable in a modeling data set.

The illustrative embodiments may allow a flow simulation to be executed a small number of times or steps (e.g. stopped after a few months of simulating 30 years, or stopped mid-simulation, etc.) and then process the results utilizing the CART process to statistically determine what the full flow simulation may have shown. Instead of performing the flow simulation utilizing finite equations and intensive computations, the initial or intermediate results of the flow simulation are utilized as a proxy for what the flow simulation would have determined if run to conclusion. As a result, flow simulation information may be obtained much more quickly and with less computational resources being utilized. The CART based results may be displayed to a user numerically, graphically, or utilizing any number of other output formats. The CART based results may also be stored or further processed.

The results, of the CART based flow simulations may subsequently be verified utilizing full flow simulations to validate the results and determine accuracy of the quicker calculations. Shorter CART-based processing may allow users, systems, and others to quickly determine which areas merit full analysis or additional review. In addition, users may be able to make important decisions and act more quickly during time sensitive situations.

Figure 1:
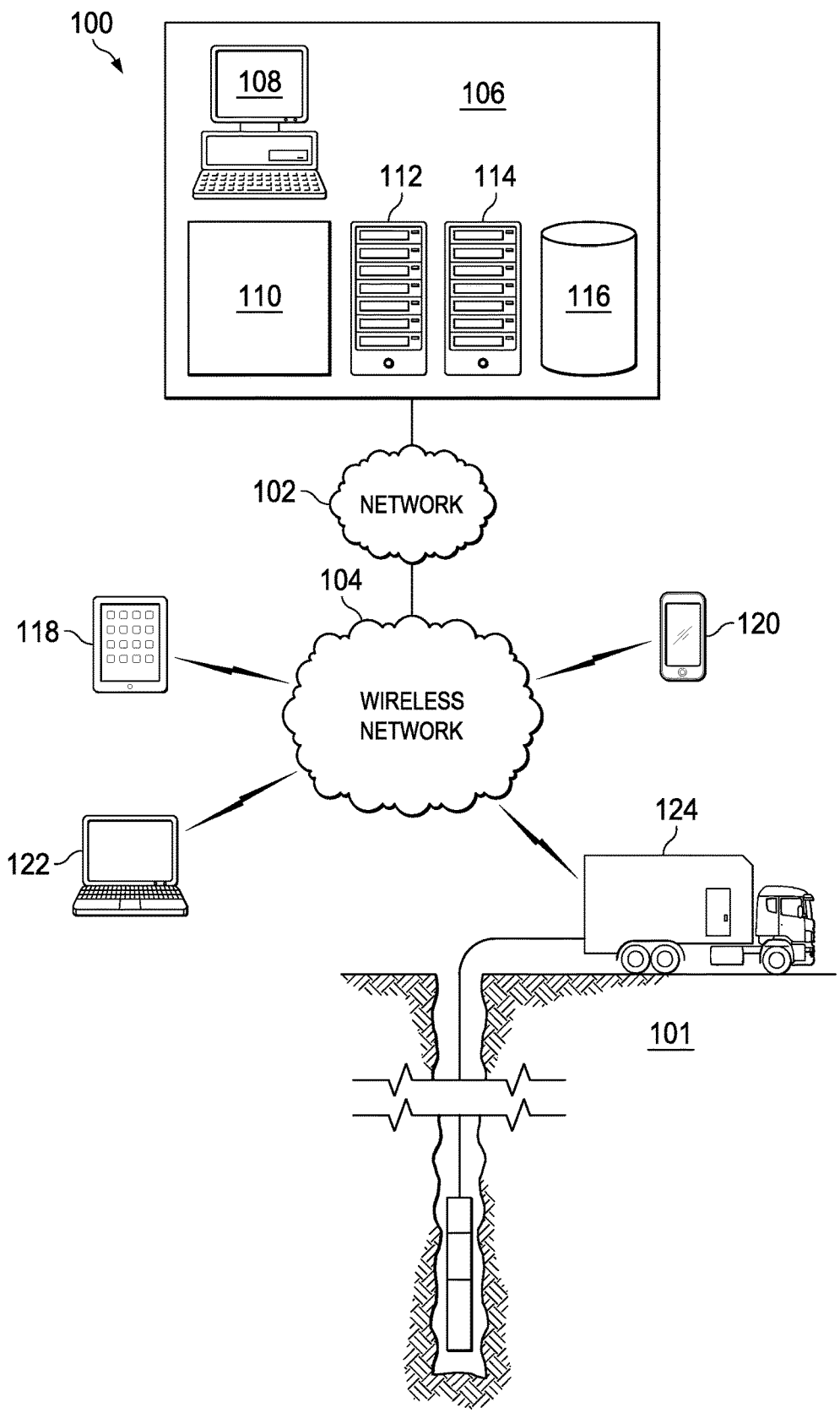
FIG. 1 is a flow simulation environment in accordance with an illustrative embodiment.

FIG. 1 is a flow simulation environment 100 in accordance with an illustrative embodiment. The flow simulation environment 100 includes a number of devices, locations, systems, and equipment that may be utilized to perform the systems and methods herein described. The flow simulation environment 100 may also include a reservoir 101. The reservoir 101 is a designated area, location, or three-dimensional space that may include natural resources, such as crude oil, natural gas, or other hydrocarbons. The illustrative embodiments may include computational and statistical analysis that may be performed by any number of devices or in any number of locations. For example, the computations may be performed on-site, off-site, at a movable location, at a headquarters, utilizing fixed computational devices, or utilizing wireless devices.

In one embodiment, the process may be performed utilizing logic such as field programmable gate arrays (FPGAs), application specific integrated circuits, computer instructions, code, programs, or applications, or any combination of software, hardware, and firmware.

In one embodiment, the flow simulation environment 100 may include a network 102, a wireless network 104, a facility 106, a personal computer 108, a management system 110, servers 112 and 114, a database 116, a tablet 118, a wireless device 120, a laptop 122, and a mobile computing system 124.

The network 102 may be any type of computing or communications network including one or more of the following networks: a wide area network, a local area network, one or more private networks, the Internet or public networks, a telephone network (e.g. publicly switched telephone network), one or more cellular networks, cloud networks, virtual networks, and other wireless and data networks. The wireless network 104 is one example of a wireless network for regional or local communications (e.g. WiFi, 4G, LTE, PCS, Bluetooth, Zigbee, WiMAX, GPRS, etc.). The network 102 and the wireless network 104 may include any number of network nodes, devices, systems, equipment, and components (not depicted), such as routers, servers, network access points/gateways, cards, lines, wires, switches, DNS servers, proxy servers, web servers, and other network nodes and devices for assisting in routing and computation of data/communications as herein described.

In one embodiment, integrated or external components of the mobile computing system 124 may be configured to penetrate in earth formation through a wellbore to stimulate, energize, and measure parameters of a formation. One or more sensors or logging tools (e.g. probes, drill string measurement devices, nuclear magnetic resonance imagers, etc.) may be integrated with or connected to the mobile computing system 124 to perform logging, data retrieval, data storage, processing, and information display. For example, the mobile computing system 124 may determine any number of static and dynamic properties. The static and dynamic properties may include measurements of or changes in pressure, depth, temperature, composition (e.g. hydrocarbon composition levels, measurements, and statistics), fluid flow rate, fluid composition, density, porosity, position and displacement, depth, and so forth.

The personal computer 108, tablet 118, wireless device 120, laptop 122, and mobile computing system 124 may execute a local program or app to perform the process herein described. In another embodiment, the CART-based proxy computations may be performed by the management system 110, servers 112 and 114, or other network devices. For example, the user may submit information and parameters utilizing the wireless device 120 to perform the calculations on the server 112 with the results being stored in the database 116 for subsequent access. The database 116 may store the static properties, dynamic properties, flow simulation results (e.g. initial values, partial output, and completed output), parameters, configuration, settings, and so forth. The database 116 may be accessed by any number of users and devices in the flow simulation environment to retrieve and update the data.

In one embodiment, the servers 112 and 114 may execute an application that is available to any of the devices of the flow simulation environment 100 through the network 102 and the wireless network 104. For example, the application may display a user interface for receiving parameters, properties, and other information for performing the CART based analysis. In one embodiment, the server 114 is a Web server that hosts the application for CART based processing that is accessible through one or more browsers utilized by any of the personal computer 108, tablet 118, wireless device 120, laptop 122, and mobile computing system 124.

Figure 2:
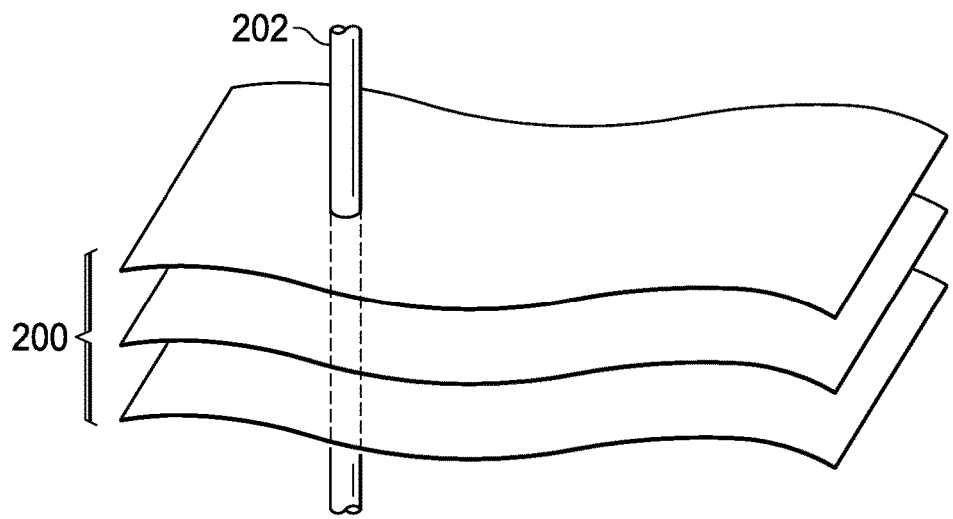
FIG. 2 illustrates multiple earth formation horizons which are penetrated by a wellbore in accordance with an illustrative embodiment.

FIG. 2 illustrates multiple earth formation horizons 200 which are penetrated by a wellbore 202 in accordance with an illustrative embodiment. The earth formation horizons 200 may represent any number of surface conditions, environments, structures, or compositions. In one embodiment, the earth formation horizons 200 represent a reservoir that is undergoing analysis. The wellbore 202 is drilled into the earth formation horizons 200 to extract wellbore fluids or gases from the formation. The size, shape, direction, and depth of the wellbore 202 may vary based on the conditions and estimated natural resources available. The wellbore 202 may include any number of support structures or materials, divergent paths, surface equipment, or so forth. In one embodiment, the flow through the earth formation horizons may be estimated utilizing CART based flow simulations.

Figure 3:
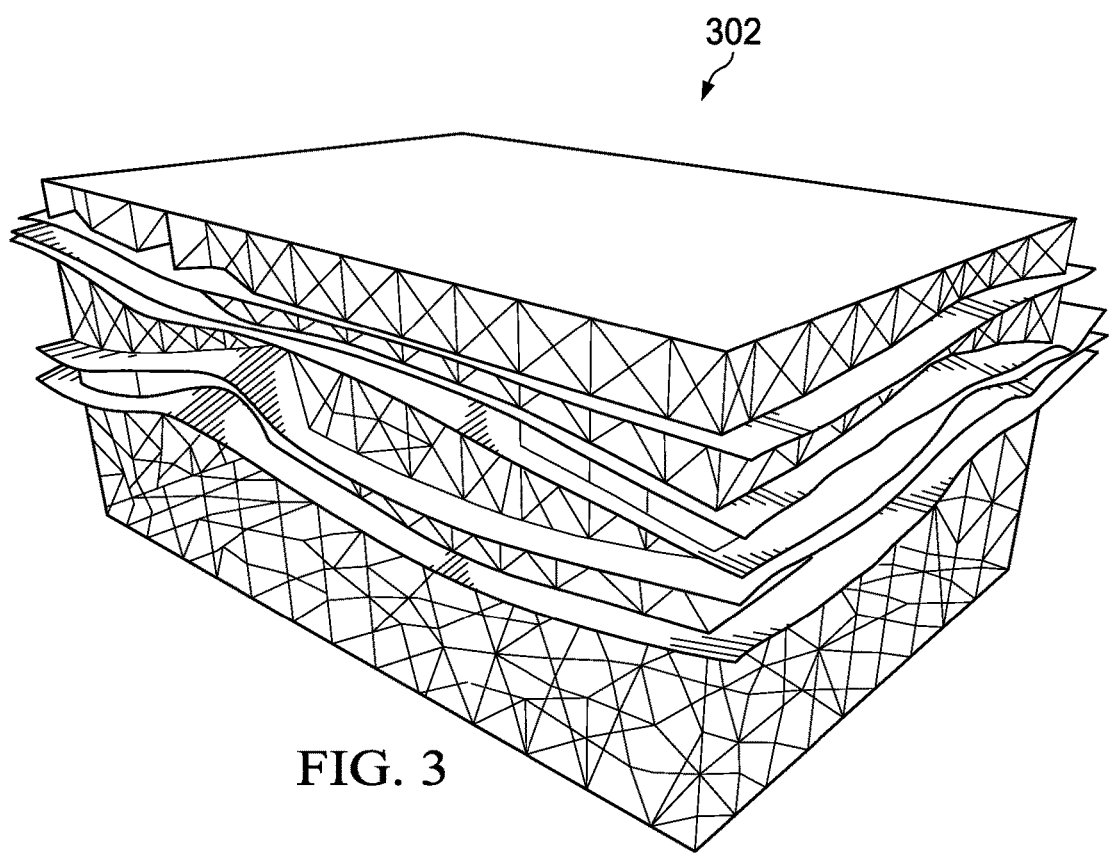
FIG. 3 illustrates multiple earth formation horizons for flow simulation in accordance with an illustrative embodiment.

FIG. 3 illustrates multiple earth formation horizons for flow simulation in accordance with an illustrative embodiment. In one embodiment, a formation 302 may include any number of horizons which transfers the longitudinal extent of the formation 302. A horizon may be the top surface of an earth formation layer, the earth formation layer including, for example, sand, shale, limestone, etc. The described embodiments may be utilized to determine the fluid properties within the formation 302.

In one embodiment, the formation may be run through a number of full-blown simulations for a time set to extract statistical patterns. The statistical patterns may be utilized as input to the CART based proxy analysis to make a number of predictions. The predictions may be based on predictor variables, such as porosity, permeability, lithological information, fracture information, historical flow information and simulations, and so forth. The CART based proxy analysis may be utilized to answer questions regarding porosity, reservoir composition oil saturation, gas saturation, water saturation, and so forth.

Figure 4:
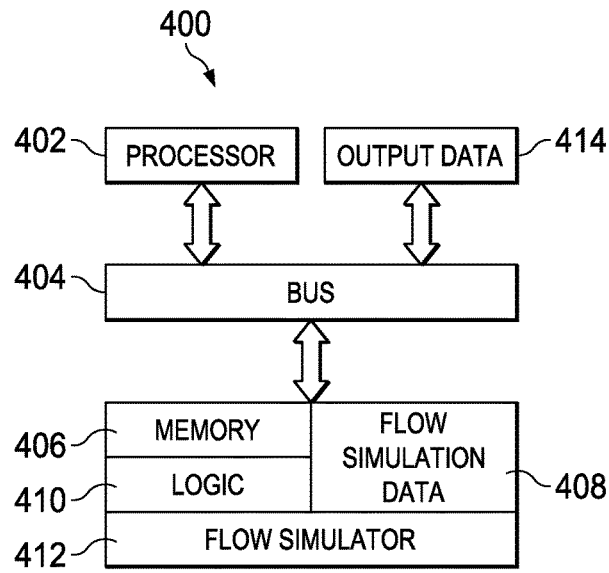
FIG. 4 is a is a block diagram of a computing system for implementing CART-based proxy flow simulations in accordance with an illustrative embodiment.

FIG. 4 is a block diagram of a computing system 400 for implementing CART based proxy flow simulations in accordance with an illustrative embodiment. The computing system 400 may represent any number of computing or communications devices, systems, or equipment as shown in FIG. 1. In one embodiment, the computing system 400 may include a processor 402, a bus 404, a memory 406, flow simulation data 408, logic 410, a flow simulator 412, and output data 414.

The processor 402 is circuitry or logic enabled to control execution of a set of instructions. The processor 402 may be microprocessors, digital signal processors, application-specific integrated circuits (ASIC), central processing units, or other devices suitable for controlling an electronic device including one or more hardware and software elements, executing software, instructions, programs, and applications, converting and processing signals and information, and performing other related tasks. The processor 402 may be a single chip or integrated with other computing or communications elements.

The memory 406 is a hardware element, device, or recording media configured to store data for subsequent retrieval or access at a later time. The memory 406 may be static or dynamic memory. The memory 406 may include a hard disk, random access memory, cache, removable media drive, mass storage, or configuration suitable as storage for data, instructions, and information. In one embodiment, the memory 406 and processor 402 may be integrated. The memory may use any type of volatile or non-volatile storage techniques and mediums.

The bus 404 is a communication system that transfers database between components of the computing system 400 including both hardware and software. For example, the bus may be one or more wires, traces, fiber optics, or so forth.

The flow simulator 412 represents logic or a program that perform full finite-difference flow simulations. The flow simulation data 408 represents the complete or partial flow simulation data generated by the flow simulator 412.

The logic 410 may represent an ASIC, program, or instructions for performing classification and regression or other forms of computational modeling. In one embodiment, the logic 410 may utilize prediction trees including regression trees and classification trees. Other forms of regressive logic may also be utilized (e.g. linear, polynomial, etc.) Utilizing a number of inputs the logic 410 is configured to determine or predict a response or class. At each internal node, the logic may apply a test to one of the inputs and based on the outcome may select a branch for analysis. At certain nodes, predictions are made. CART based logic may be utilized to simply model an entire space, such as an earth formation. The input data may be sub-divided into clusters or cells for simplifying the CART based proxy calculations. Regions of the cells may together represent a neighborhood. In one embodiment, the logic 410 may utilize a 3×3×3 neighborhood of 27 cells. In another embodiment, the logic 410 may utilize a 5×5×5 neighborhood of 125 cells or neighborhoods of any number of other sizes (e.g. going back two time steps instead of one).

The flow simulator 412 may execute a simulation for a time set to extract statistical patterns (e.g. porosity, permeability, fracture information, past flows, etc.) that are used as the input by the logic 410.

The output data 414 represents the data that is generated by the logic 410. The output data 414 may represent a prediction determined by the logic 410 that is determined based on the predictor variables/input included within the flow simulation data 408. In one embodiment, the CART based determinations made by the logic may answer any number of questions, such as is the porosity above 8% for an earth formation or a designated portion of the earth formation, is the water saturation above 50%, is there a shale barrier.

Figure 5:
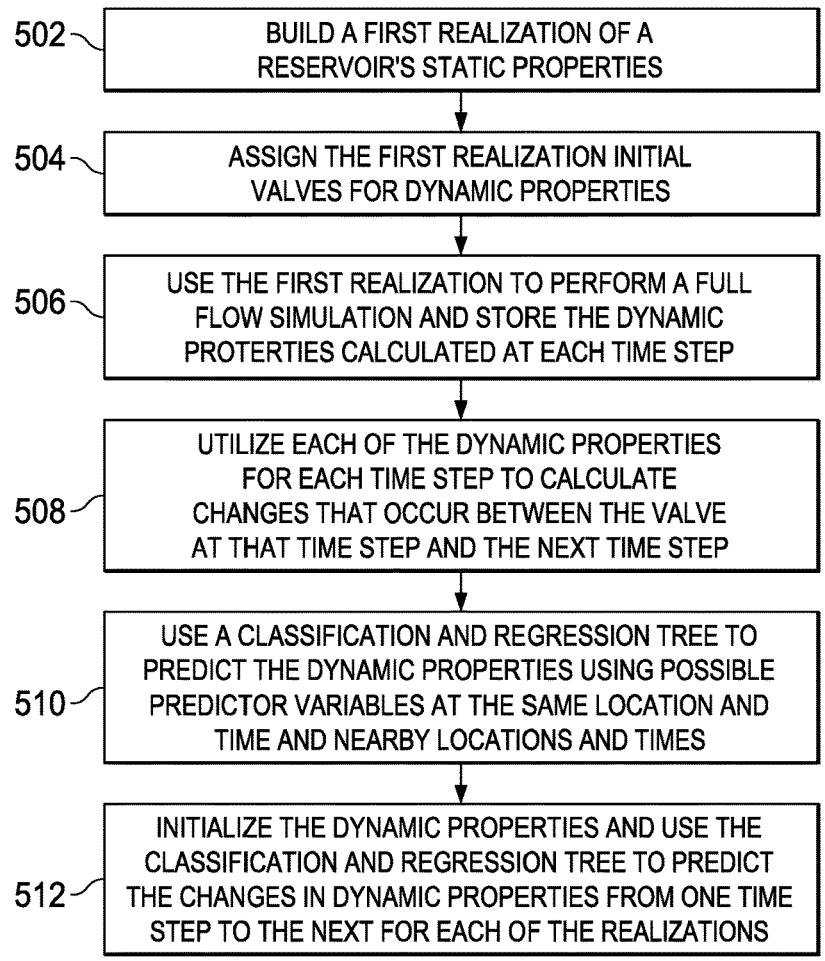
FIG. 5 is a flowchart of a process for CART-based proxy flow simulations for ranking geostatistical realizations of rock properties in accordance with an illustrative embodiment.

FIG. 5 is a flowchart of a process for CART-based proxy flow simulations for ranking geostatistical realizations of static rock properties in accordance with an illustrative embodiment. The process of FIG. 5 may be implemented by a computing or communications device. The process may also be implemented utilizing logic including hardware, software, firmware, or a combination thereof.

The process may begin by building a first realization of a reservoir's static properties (step 502). The realizations may be a first set of realizations performed a number of times (n). In one embodiment, the static properties are porosity ($\Phi$) and permeability (k). Permeability is extended to relative permeability curves in static properties. In one embodiment, each realization is a block model that has porosity and permeability values for every block. For example, $\Phi(r,c,l)$ is the porosity for the $r^{th}$, the $c^{th}$ column and the $l^{th}$ level at the $t^{th}$ time step.

Next, system assigns the first realization the initial values for dynamic properties (step 504). In one embodiment, the dynamic properties are pressure (P), water saturation ($S_w$), oil saturation ($S_o$) and Gas Saturation ($S_g$). The realization may be a block model that has pressure and saturation values for every block and for every step. For example $S_o(r,c,l,t)$ is the oil saturation for the $r^{th}$ row, the $c^{th}$ column and the $l^{th}$ level at the $t^{th}$ time step.

Next, the system use the first realization to perform a full flow simulation and store the dynamic properties calculated at each time step (step 506). For example, the pressure in block (r,c,l) may change as the flow simulation proceeds. The values $P(r,c,l,t_o)$, $P(r,c,lt_l)$, ... $P(r,c,lt_{final})$ are stored along with the time-varying values of the water, oil, and gas saturations. The flow simulations may be a comprehensive finite-difference flow simulation. In one embodiment, the flow simulations may be performed by an oil and gas reservoir simulator, such as NEXUS developed, marketed, and maintained by Landmark Graphics. However, any number of flow simulation software or hardware may be utilized.

Next, the system utilizes each of the dynamic properties for each time step to calculate change that occurs between the value at that time step and the next time step (step 508). For example, the upcoming change in pressure in block (r,c,l) at time step 20 may be calculated as follows: $\Delta P(r,c,l,t_{20})=P(r,c,l,t_{21})-P(r,c,l,t_{20})$.

Next, the system uses a classification and regression tree (CART) to predict the dynamic properties ($\Delta P$, $\Delta S_w$, $\Delta S_g$, etc.) using as possible predictor variables at the same location and time and at nearby locations and times (step 510). In one embodiment, the nearby locations may include the block where the prediction is needed. For example, 26 neighboring blocks may be analyzed at the same time and the same group may be analyzed of 27 may be For example, for each of 54 blocks in a neighborhood, the associated static and dynamic properties may serve as possible predictor variables along with a change in their dynamic properties. The CART based decisions may predict the answers to a number of "yes" and "no" questions that are posed. A decision tree may include hundreds of questions and even with all of the questions, the computational analysis of CART is still a magnitude simpler.

Next, the system initializes the dynamic properties (at t=0) and uses the classification and regression tree to predict the changes in dynamic properties from one time step to the next for each of the realizations (step 512). The CART predictions developed from the first realization serve as a rapid proxy for a full flow simulation that may be used to rank the other n–1 realizations. Once ranked, a small group of representative realizations may be selected and their flow performance may be confirmed through a full flow simulation. The rapid proxy outputs may be processed utilizing one or more algorithms to display information statistically, graphically, or visually. For example, the changes in dynamic properties may be visualized utilizing a modeling system (e.g. graphs, videos, pictures, etc.) that varies over time to demonstrate the flow to the user.

Next, the rapid proxy results may be utilized to determine potential flows at the location, make drilling or production decisions, or do further analysis.

In summary, the disclosed embodiments include a method, computer program product, and system for performing classification and regression tree flow simulations for a reservoir. In one embodiment, a computer-implemented method performs CART flow simulations for a reservoir. A partial flow simulation is performed. Dynamic properties associated with the partial flow simulation are stored for each time step. CART is utilized to predict changes in the dynamic properties utilizing stored dynamic properties determined by the partial flow simulation. In one embodiment, a number of static properties associated with the reservoir are determined. A number of realizations of the static properties associated with the reservoir are built. In one embodiment, each of the number of realizations is a block model. In some embodiments, the static properties include at least porosity and permeability. Various embodiments include assigning initial values for the dynamic properties associated with the reservoir before performing the flow simulation. In one embodiment, the stored dynamic properties include changes determined between time steps. In another embodiment, each of the number of realizations are ranked. In alternative embodiments, two or more of the number of realizations are selected. The predicted changes in the dynamic properties determined utilizing CART are confirmed utilizing a full flow simulation.

In another embodiment, a non-transitory computer readable medium comprising computer executable instructions to perform a partial flow simulation, store dynamic properties associated with the partial flow simulation for each time step, and utilize CART to predict changes in the dynamic properties utilizing the stored dynamic properties determined by the partial flow simulation. In some embodiments, the one or more machines determine a number of realizations utilizing static properties associated with the reservoir, and assign initial values for the dynamic properties. In one embodiment, the static properties include at least porosity and permeability, and wherein the dynamic properties include at least pressure, water saturation, oil saturation, and gas saturation. In another embodiment, the one or machine select two or more of the number of realizations, and confirm the predicated changes in the dynamic properties determined utilizing CART utilizing a full flow simulation. In yet another embodiment, the one or more machines rank each of the number of realizations.

Another embodiment provides a system for performing CART flow simulations from reservoir. The system includes one or more computing devices configured to receive input from a user, a server in communication with one or more computing devices through one or more networks, and a database in communication with the one or more server through the one or more networks. The server is performs a partial flow simulation. The server stores dynamic properties associated with the partial flow simulation for each time step in the database. The server further utilizes CART to predict changes in the dynamic properties utilizing the stored dynamic properties determined by the partial flow simulation. In one embodiment, the server determines a number of realizations utilizing static properties associated with the reservoir. In some embodiments, the static properties include at least porosity and permeability, and wherein the dynamic properties include at least pressure, water saturation, oil saturation, and gas saturation. In another embodiment, the server assigns initial values for the dynamic properties performing the flow simulation. In some embodiments, the one or more computing devices represent one or more of personal computing devices and wireless devices.

As used herein, the singular forms "a", "an" and "the" are intended to include the plural forms as well, unless the context clearly indicates otherwise. It will be further understood that the terms "comprise" and/or "comprising," when used in this specification and/or the claims, specify the presence of stated features, integers, steps, operations, elements, and/or components, but do not preclude the presence or addition of one or more other features, integers, steps, operations, elements, components, and/or groups thereof. The corresponding structures, materials, acts, and equivalents of all means or step plus function elements in the claims below are intended to include any structure, material, or act for performing the function in combination with other claimed elements as specifically claimed. The description of the present system and method has been presented for purposes of illustration and description, but is not intended to be exhaustive or limited to the invention in the form disclosed. Many modifications and variations will be apparent to those of ordinary skill in the art without departing from the scope and spirit of the described systems and methods. The embodiment was chosen and described to explain the principles of the system and methods and the practical application, and to enable others of ordinary skill in the art to understand the various embodiments with various modifications as are suited to the particular use contemplated. The scope of the claims is intended to broadly cover the disclosed embodiments and any such modification.

The previous detailed description is of a small number of embodiments for implementing the system and method and is not intended to be limiting in scope. The following claims set forth a number of the embodiments of the system and method disclosed with greater particularity.

What is claimed:

1. A computer-implemented method for performing classification and regression tree (CART) flow simulations for a reservoir, the method comprising:
    building, by a computer system coupled to one or more measurement devices of a drill string disposed within a wellbore being drilled through the reservoir, a plurality of realizations of static properties associated with the reservoir, based on measurements made by the one or more measurement devices as the wellbore is drilled through a first area of the reservoir;
    assigning initial values of the reservoir's dynamic properties to a first of the realizations;
    performing a partial flow simulation for a plurality of time steps using the first realization to determine intermediate values of the reservoir's dynamic properties;
    storing the intermediate values of the reservoir's dynamic properties determined at each time step of the partial flow simulation;
    predicting changes in the reservoir's dynamic properties for each of the plurality of realizations, based on a CART and the stored intermediate values of the reservoir's dynamic properties determined from the partial flow simulation performed with the first realization; and
    controlling, by the computer system, the drill string to drill the wellbore through a second area of the reservoir, based on the predicted changes.

2. The computer-implemented method according to claim 1, wherein the static properties associated with the reservoir serve as predictor variables that are used with the CART for predicting the changes in the dynamic properties.

3. The computer-implemented method according to claim 1, wherein predicting comprises:
    utilizing the CART and the stored intermediate results to make predictions with respect to changes in the reservoir's dynamic properties expected during a full flow simulation to be performed using the first realization; and
    utilizing the CART based predictions made for the first realization to predict changes in the dynamic properties for a full flow simulation to be performed for each remaining realization.

4. The computer-implemented method according to claim 1, wherein each of the plurality of realizations is a block model.

5. The computer-implemented method according to claim 1, wherein the static properties include at least porosity and permeability.

6. The computer-implemented method according to claim 1, wherein assigning comprises:
    initializing the dynamic properties associated with the reservoir for each of the plurality of realizations before performing the partial flow simulation.

7. The computer-implemented method according to claim 1, wherein the dynamic properties include at least pressure, water saturation, oil saturation, and gas saturation.

8. The computer-implemented method according to claim 1, wherein the stored intermediate values of the reservoir's dynamic properties include changes in one or more of the dynamic properties' values determined between time steps of the partial flow simulation.

9. The computer-implemented method according to claim 1, further comprising:
ranking each of the plurality of realizations based on the changes predicted in the reservoir's dynamic properties.

10. The computer-implemented method according to claim 9, further comprising:
selecting at least two of the plurality of realizations for a full flow simulation to be performed, based on the ranking;
performing the full flow simulation with the selected realizations to determine final values of the dynamic properties; and
confirming the predicated changes in the reservoir's dynamic properties based on the final values determined as a result of the full flow simulation performed with the selected realizations.

11. A non-transitory computer readable medium comprising computer executable instructions for performing classification and regression tree (CART) flow simulations for a reservoir, the computer executable instructions when executed by a computer causes the computer to perform operations, including operations to:
build a plurality of realizations of static properties associated with the reservoir, based on measurements made by one or more measurement devices of a drill string as a wellbore is drilled through a first area of the reservoir;
assign initial values of the reservoir's dynamic properties to a first of the realizations;
perform a partial flow simulation for a plurality of time steps using the first realization to determine intermediate values of the reservoir's dynamic properties;
store the intermediate values of the reservoir's dynamic properties determined at each time step of the partial flow simulation;
predict changes in the reservoir's dynamic properties for each of the plurality of realizations, based on a CART and the stored intermediate values of the reservoir's dynamic properties determined from the partial flow simulation performed with the first realization; and
control the drill string to drill the wellbore through a second area of the reservoir, based on the predicted changes.

12. The computer readable medium according to claim 11, wherein the operations performed by the computer further include operations to:
initialize the dynamic properties for each of the plurality of realizations before the partial flow simulation is performed.

13. The computer readable medium according to claim 11, wherein the static properties include at least porosity and permeability, and wherein the dynamic properties include at least pressure, water saturation, oil saturation, and gas saturation.

14. The computer readable medium according to claim 11, wherein the operations performed by the computer further include operations to:
select at least two of the plurality of realizations for a full flow simulation to be performed;
perform the full flow simulation with the selected realizations to determine final values of the dynamic properties; and
confirm the predicated changes in the reservoir's dynamic properties based on the final values determined as a result of the full flow simulation performed with the selected realizations.

15. The computer readable medium according to claim 14, wherein the operation to select at least two of the plurality of realizations includes operations to:
rank each of the plurality of realizations based on the changes predicted in the reservoir's dynamic properties, and
select at least two of the plurality of realizations based on the ranking.

16. A system for performing classification and regression tree (CART) flow simulations for a reservoir comprising:
a processor; and
a memory coupled to the processor, the memory having instructions stored therein, which when executed by the processor, cause the processor to perform operations, including operations to:
build a plurality of realizations of static properties associated with the reservoir, based on measurements made by one or more measurement devices of a drill string as a wellbore is drilled through a first area of the reservoir;
assign initial values of the reservoir's dynamic properties to a first of the realizations;
perform a partial flow simulation for a plurality of time steps using the first realization to determine intermediate values of the reservoir's dynamic properties;
store the intermediate values of the reservoir's dynamic properties determined at each time step of the partial flow simulation;
predict changes in the reservoir's dynamic properties for each of the plurality of realizations, based on a CART and the stored intermediate values of the reservoir's dynamic properties determined from the partial flow simulation performed with the first realization; and
control the drill string to drill the wellbore through a second area of the reservoir, based on the predicted changes.

17. The system according to claim 16, wherein each of the plurality of realizations is a block model representing the static properties associated with the reservoir.

18. The system according to claim 16, wherein the static properties include at least porosity and permeability, and wherein the dynamic properties include at least pressure, water saturation, oil saturation, and gas saturation.

19. The system according to claim 16, wherein the operations performed by the processor further include operations to: initialize the dynamic properties for each of the plurality of realizations before performing the partial flow simulation.

20. The system according to claim 16, wherein the instructions stored in the memory are associated with a flow simulator application that is executable by the processor and accessible to one or more computing devices via a wireless communication network, and the operations performed by the processor for executing the flow simulator application are initiated based on user input received from the one or more computing devices via the wireless communication network.

* * * * *